United States Patent
Gohara et al.

(10) Patent No.: US 10,446,460 B2
(45) Date of Patent: Oct. 15, 2019

(54) SEMICONDUCTOR DEVICE

(71) Applicant: Fuji Electric Co., Ltd., Kanagawa (JP)

(72) Inventors: Hiromichi Gohara, Nagano (JP);
Kohei Yamauchi, Nagano (JP); Shinji Tada, Tokyo (JP); Tatsuo Nishizawa, Nagano (JP); Yoshitaka Nishimura, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/914,852

(22) Filed: Mar. 7, 2018

(65) Prior Publication Data
US 2018/0315676 A1 Nov. 1, 2018

(30) Foreign Application Priority Data
Apr. 27, 2017 (JP) .................. 2017-088862

(51) Int. Cl.
*H01L 23/48* (2006.01)
*H01L 23/31* (2006.01)
(Continued)

(52) U.S. Cl.
CPC ...... *H01L 23/3121* (2013.01); *H01L 23/3735* (2013.01); *H01L 23/49811* (2013.01); *H01L 23/49833* (2013.01); *H01L 23/49838* (2013.01); *H01L 23/5385* (2013.01); *H01L 24/48* (2013.01); *H01L 24/49* (2013.01); *H01L 25/0655* (2013.01); *H01L 25/072* (2013.01); *H01L 25/074* (2013.01); *H01L 25/16* (2013.01);
(Continued)

(58) Field of Classification Search
CPC ........... H01L 23/3121; H01L 23/49811; H01L 23/49833; H01L 23/5385; H01L 23/3735; H01L 25/072; H01L 25/18; H01L 25/074
See application file for complete search history.

(56) References Cited

U.S. PATENT DOCUMENTS 7,224,054 B2 * 5/2007 Shibata ................. H01L 23/055
257/673
7,759,785 B2 * 7/2010 Corisis .............. H01L 23/49827
257/690

(Continued)

FOREIGN PATENT DOCUMENTS

JP H2-281645 A 11/1990
JP 2000-200855 A 7/2000

(Continued)

*Primary Examiner* — Hoa B Trinh
(74) *Attorney, Agent, or Firm* — Chen Yoshimura LLP

(57) ABSTRACT

The semiconductor device includes a first insulating circuit substrate; a semiconductor chip including a plurality of control electrodes, disposed on the first insulating circuit substrate; a second insulating circuit substrate including a plurality of first through-holes in which conductive members are arranged on inner walls and/or an outer periphery of ends of the first through-holes, the second insulating circuit substrate being disposed above the semiconductor chips; and first pins inserted into the first through-holes and having at one end a columnar part connected to the control electrodes of the semiconductor chips, and having at another end a head part that is wider than an inner diameter of the first through-holes.

16 Claims, 11 Drawing Sheets

(51) Int. Cl.
*H01L 25/065* (2006.01)
*H01L 25/18* (2006.01)
*H01L 25/07* (2006.01)
*H01L 23/00* (2006.01)
*H01L 23/373* (2006.01)
*H01L 23/498* (2006.01)
*H01L 23/538* (2006.01)
*H01L 25/16* (2006.01)

(52) U.S. Cl.
CPC .... *H01L 25/18* (2013.01); *H01L 2924/13055* (2013.01)

(56) References Cited

U.S. PATENT DOCUMENTS

| | | |
|---|---|---|
| 9,059,009 B2 | 6/2015 | Horio et al. |
| 2008/0224298 A1* | 9/2008 | Corisis .............. H01L 23/49827 257/690 |
| 2016/0035646 A1 | 2/2016 | Soyano |

FOREIGN PATENT DOCUMENTS

| | | |
|---|---|---|
| WO | 2013/118415 A1 | 8/2013 |
| WO | 2015/045648 A1 | 4/2015 |

* cited by examiner

SEMICONDUCTOR DEVICE

BACKGROUND OF THE INVENTION

Technical Field

The present invention relates to a semiconductor device having a semiconductor chip sensing function.

Background Art

FIG. 13 of Patent Document 1 discloses a lead pin block placed on a metal plate and on a semiconductor chip. The lead pin block includes a plurality of lead pins, one end of which is vertically connected to the top of the semiconductor chip, the center portion of the lead pins curving inside the lead pin block and being drawn to outside from the side face of the lead pin block, and the other end of the lead pins curving and extending upward.

Patent Document 2 discloses a PGA wiring substrate for enhancing pin attachment strength, improving adhesive strength of a pad and resin layer below the pad, and contributing to an improvement in connection reliability. A conductor layer having the pad is formed on one surface of the substrate, and an opening is formed in a portion corresponding to the pad in a solder resist layer formed on the conductor layer, the opening area of the opening widening in the thickness direction of the solder resist layer toward the inner direction of the substrate. A large-diameter head of a T-shaped pin is disposed inside the opening and secured with solder.

Patent Document 3 discloses a semiconductor device, including: a circuit substrate having a wiring pattern provided on the surface of an organic insulating substrate that has an opening for forming a device placement section; a conductor pin in which a nail-shaped head is bonded to an electrode portion used for conductor pin connection of the wiring pattern; a heat dissipation metal plate adhered to the rear surface of the circuit substrate and closing one end of the opening; a semiconductor chip mounted on the metal plate in the opening and electrically connected to a bonding pad part of the wiring pattern; and a resin member selectively sealing the device, including the opening.

RELATED ART DOCUMENTS

Patent Documents

Patent Document 1: WO 2015/045648
Patent Document 2: Japanese Patent Application Laid-Open Publication No. 2000-200855
Patent Document 3: Japanese Patent Application Laid-Open Publication No. H2-281645

SUMMARY OF THE INVENTION

Patent Document 1 was problematic in that the intervals between the lead pins on the chip were the same as the intervals between the other ends of the lead pins, which makes it impossible to reduce chip size (see FIG. 16 in Patent Document 1).

Furthermore, Patent Document 2 was problematic in that the manufacturing process was complex, due to the opening being formed in the portion corresponding to the pad in the solder resist layer formed on the conductor layer, the opening area of the opening widening in the thickness direction of the solder resist layer toward the inner direction of the substrate, and the large-diameter head of the T-shaped pin being disposed inside the opening and secured with solder.

Moreover, Patent Document 3 exposes the boundary between the nail-shaped head of the conductive pin and the rod-shaped part, and thus there is a risk of fracturing caused by stress being concentrated on the boundary if pressure were to be exerted on the rod-shaped part of the conductive pin from the lateral side.

In view of the aforementioned problems, the present invention aims at providing a semiconductor device that has a smaller installation area than conventional configurations and a shorter internal wiring distance of control signals.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a first insulating circuit substrate; a semiconductor chip that is disposed on the first insulating circuit substrate, the semiconductor chip including a plurality of control electrodes; a second insulating circuit substrate disposed above the semiconductor chips on the first insulating circuit substrate, the second insulating circuit having a plurality of first through-holes, in which conductive members are respectively provided on an inner wall and/or on an outer periphery of one end of the first through-holes; and first pins inserted into the first through-holes, respectively, each of the first pins having at one end a columnar part connected to one of the control electrodes of the semiconductor chip, and at another end, a head part that is wider than an inner diameter of the corresponding first through-hole. With this configuration, the columnar part of the first pins is covered by the conductive member, and it is possible for the boundary between the head part and columnar part of the first pins to be made unsusceptible to stress; thus, it is possible to make it harder for disconnection of the first pins to occur when filling the resin between the first insulating circuit substrate and second insulating circuit substrate.

In one embodiment of the aforementioned semiconductor device, the semiconductor device further includes external control terminals, wherein the second insulating circuit substrate further has a plurality of second through-holes into which the external control terminals are respectively inserted, and a wiring layer conductively respectively connecting the conductive members and the external control terminals, and wherein intervals between the first pins are narrower than intervals between the external control terminals. With this configuration, the intervals between the first pins are narrow; thus, it is possible to use smaller semiconductor chips and to arrange and integrate a large number of wires.

In one embodiment of the aforementioned semiconductor device, a diameter of the columnar part of the first pins is less than a diameter of the external control terminals. With this configuration, it is possible to use smaller semiconductor chips. For example, the diameter of the columnar part of the first pins is not less than 0.1 mm and not more than 1 mm.

In one embodiment of the aforementioned semiconductor device, the semiconductor device further includes second pins, wherein the second insulating circuit substrate further includes a rear surface conductive layer provided on a rear side facing the first insulating circuit substrate, and the second pins are conductively connected to the rear surface conductive layer. With this configuration, wire bonding is not used; thus, the distance between main wiring lines can be shortened more than that in a structure that uses wire bonding. The thickness of the main electrode pins is not less than 1 mm and not more than 3 mm, for example.

In one embodiment of the aforementioned semiconductor device, the semiconductor device further includes second pins, wherein the second insulating circuit substrate is a multilayer wiring substrate that includes conductive layers and insulating layers that are laminated alternately, and has holes penetrating through at least one of the insulating layers facing the first insulating circuit substrate, and wherein the second pins are conductively connected to one of the conductive layers through said holes in the at least one of the insulating layers. With this configuration, the current flow path cross-sectional area of the main wiring of the second insulating circuit substrate can be made wider; thus, it is possible for the semiconductor device to have higher output.

In one embodiment of the aforementioned semiconductor device, the semiconductor chip is provided in a plurality, including a first semiconductor chip and a second semiconductor chip, and the first insulating circuit substrate includes: a first insulating plate; a first conductive member on the first insulating plate, mounting the first semiconductor chip on a top thereof; and a second conductive member on the first insulating plate, mounting the second semiconductor chip on a top thereof, and wherein the second insulating circuit substrate includes an insulating layer, a first conductive layer below the insulating layer in a first region corresponding to the first conductive member in position of the first insulating circuit substrate, and a second conductive layer on the insulating layer in a second region corresponding to the second conductive member in position of the first insulating circuit substrate, wherein the second insulating circuit substrate further includes a third conductive layer below the insulating layer in the second region opposite to the second conductive layer, and a fourth conductive layer on the insulating layer in the first region opposite to the first conductive layer, and wherein the third conductive layer is conductively connected to the fourth conductive layer through a hole in the insulating layer. With this configuration, when the first semiconductor chip transitions from an ON state to an OFF state and when the second semiconductor chip transitions from an OFF state to an ON state, the direction of the tail current flowing through the first conductive layer and the direction of the rising current flowing through the fourth conductive layer become reversed; thus, the magnetic field generated by the tail current flowing through the first conductive layer causes an induced electromotive force to be generated in the fourth conductive layer, which makes it possible to increase the rising current of the fourth conductive layer. Furthermore, the time required for the switching in the semiconductor device can be shortened, which makes it possible to improve the operating frequency of the semiconductor device.

In one embodiment of the aforementioned semiconductor device, the semiconductor device further includes a plurality of second pins divided into a first group and a second group, wherein the first insulating circuit substrate includes a conductive block on the second conductive member, wherein the second insulating circuit substrate includes a third through-hole into which the third conductive block is inserted, wherein the first conductive member is conductively connected to a bottom of the first semiconductor chips, wherein a top of the first semiconductor chips is conductively connected to the first conductive layer via the first group of the second pins, wherein the first conductive layer conductively connects to a bottom of the second semiconductor chip on the second conductive member via the second conductive member and the conductive block, and wherein a top of the second semiconductor chip is conductively connected to the third conductive layer via the second group of the second pins. With this configuration, it is possible to manufacture a semiconductor device that includes a circuit having upper arm semiconductor chips and lower arm semiconductor chips.

In one embodiment of the aforementioned semiconductor device, the conductive block has, on at least a portion of an outer periphery, a step protruding further than a top of the conductive block in a lateral direction. With this configuration, it is easier to position the second insulating circuit substrate.

In one embodiment of the aforementioned semiconductor device, the semiconductor device may further include a sealing resin that seals a space between the first insulating circuit substrate and the second insulating circuit substrate.

In one embodiment of the aforementioned semiconductor device, the semiconductor chip may be a vertical RC-IGBT including a switching element and a diode.

With this configuration, an IGBT, which is a switching element, and a free-wheeling diode can be embedded inside a single semiconductor chip, and thus the semiconductor device can be made smaller.

According to aspects of the present invention, it is possible to provide a semiconductor device that has a smaller installation area than conventional configurations and a shorter internal wiring distance for control signals.

It is to be understood that both the foregoing general description and the following detailed description are exemplary and explanatory, and are intended to provide further explanation of the invention as claimed.

DETAILED DESCRIPTION OF EMBODIMENTS

Figure 1:
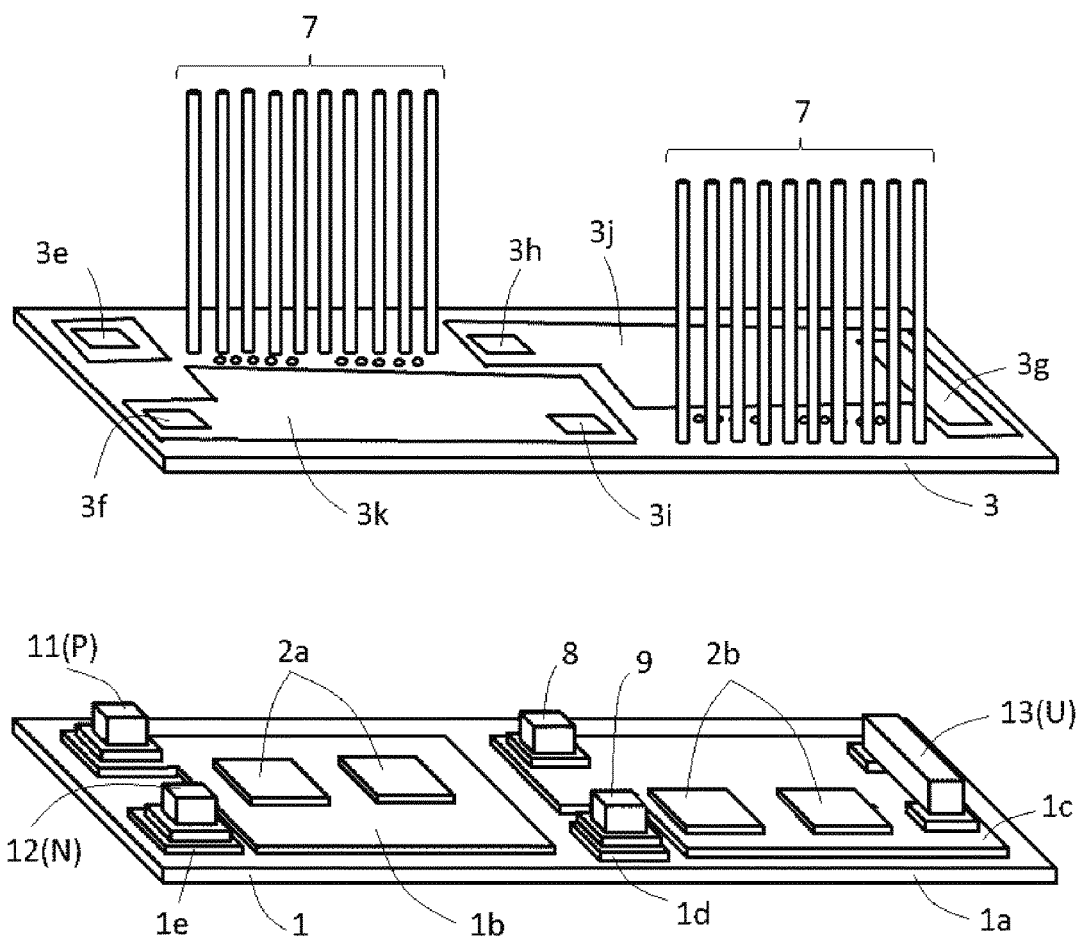
FIG. 1 is an exploded perspective view of a semiconductor device according to one embodiment of the present invention.

Examples of an embodiment of a semiconductor device of the present invention will be explained below with reference to the drawings. The same reference characters are given to the same constituent elements, and redundant explanations will be omitted. The present invention is not limited to the embodiment described below, and can be implemented by appropriately modifying the embodiment described below without departing from the spirit of the present invention.

Figure 2:
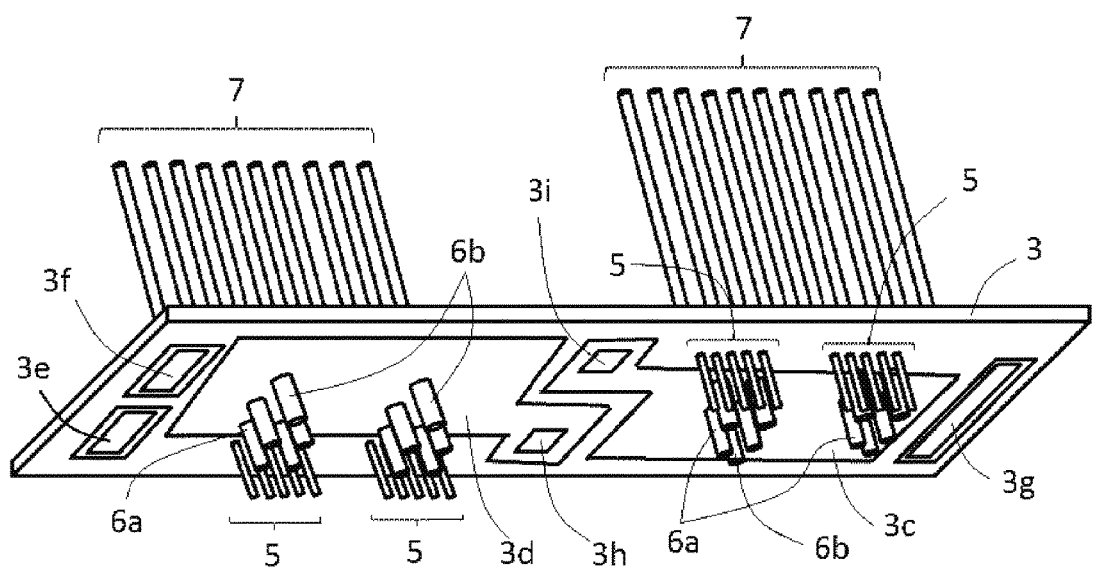
FIG. 2 is an oblique view from below of a second insulating circuit substrate of the semiconductor device according to one embodiment of the present invention.
Figure 3:
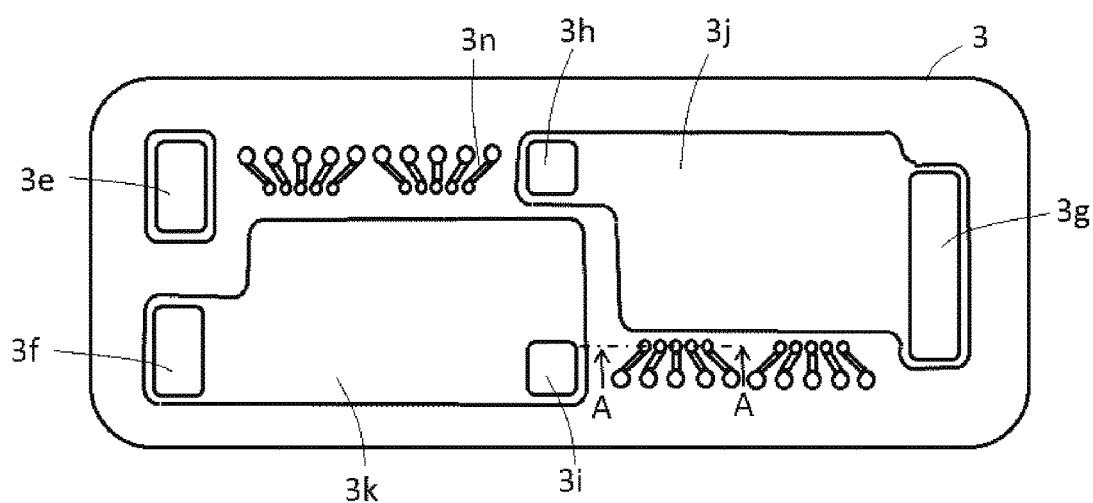
FIG. 3 is a top view of the second insulating circuit substrate of the semiconductor device according to one embodiment of the present invention.
Figure 4:
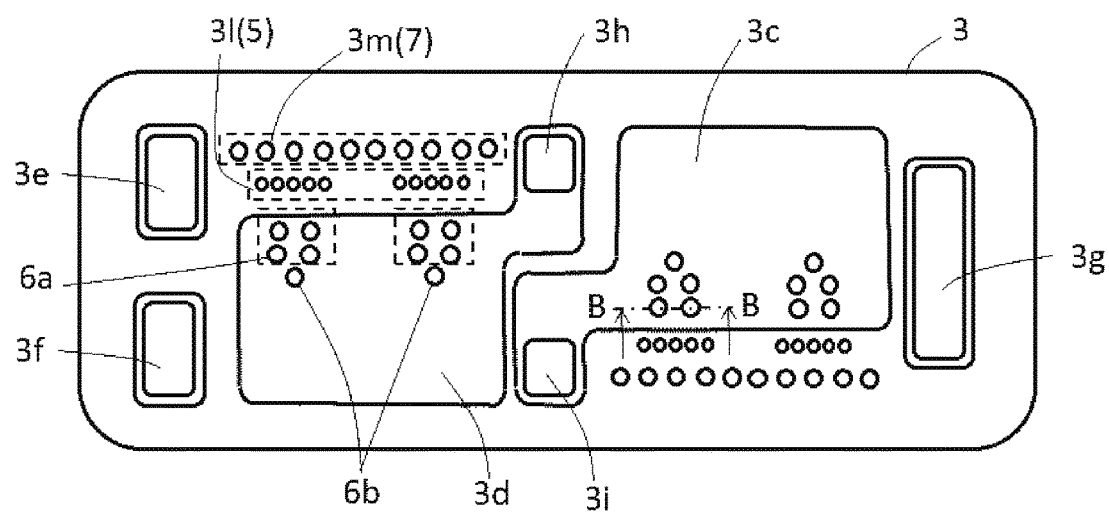
FIG. 4 is a perspective view of the bottom of the second insulating circuit substrate of the semiconductor device according to one embodiment of the present invention as seen from the top side.
Figure 5:
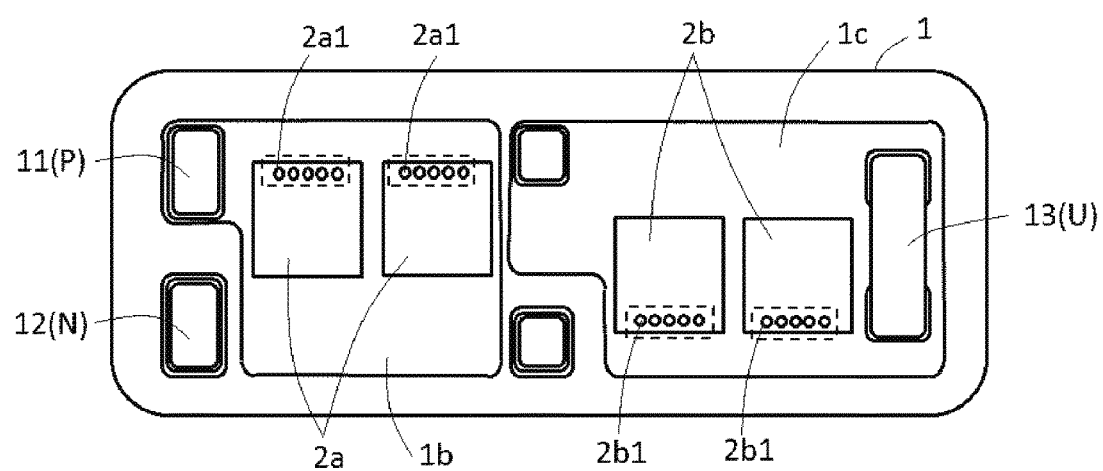
FIG. 5 is a top view of a first insulating circuit substrate of the semiconductor device according to one embodiment of the present invention.
Figure 6:
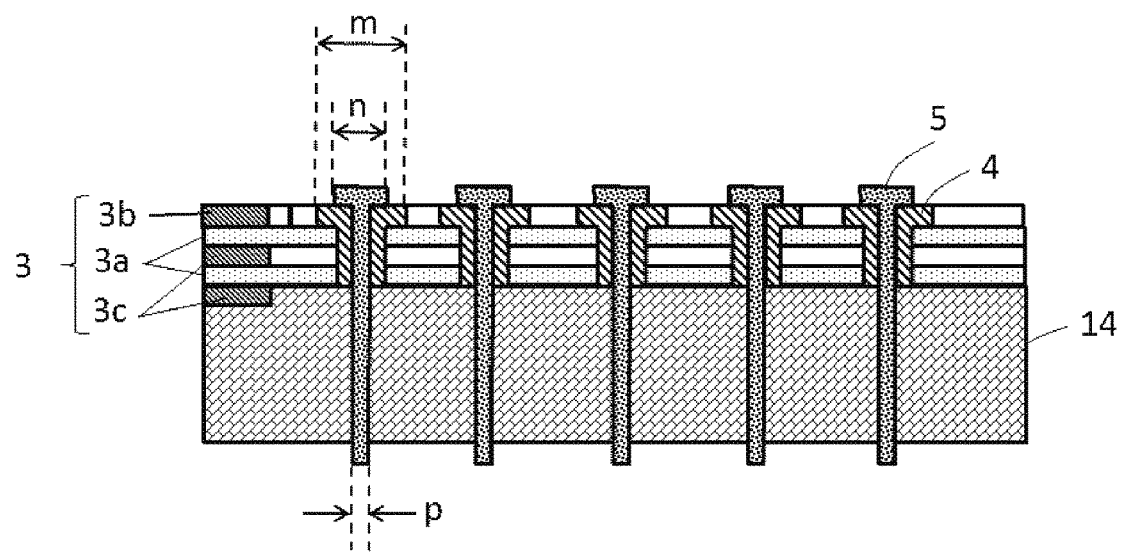
FIG. 6 is a view of the cross section of the second insulating circuit substrate shown by the arrows A-A in FIG. 3.
Figure 7:
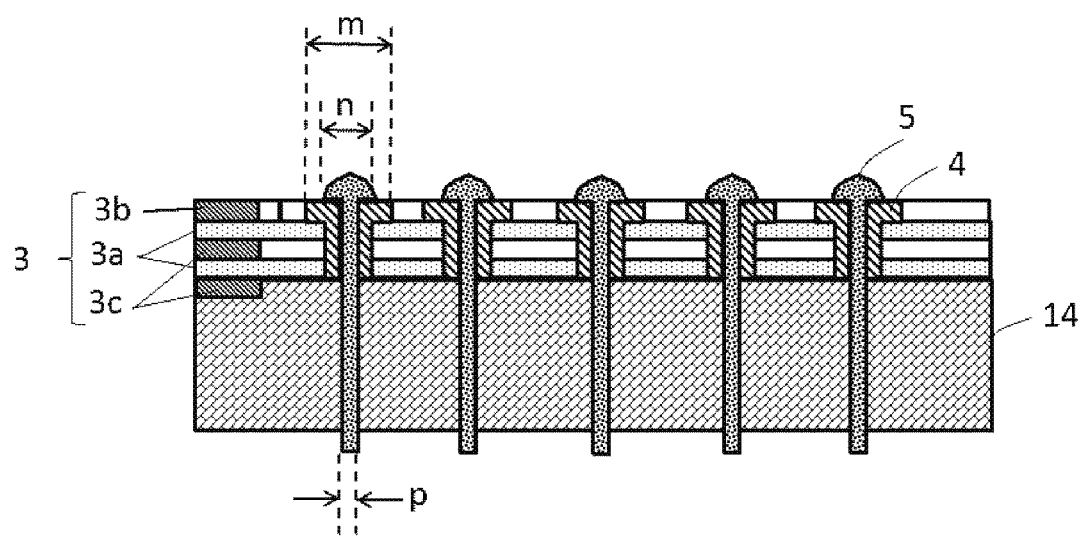
FIG. 7 is a view of a different aspect of the A-A cross section of the second insulating circuit substrate shown in FIG. 6.
Figure 8:
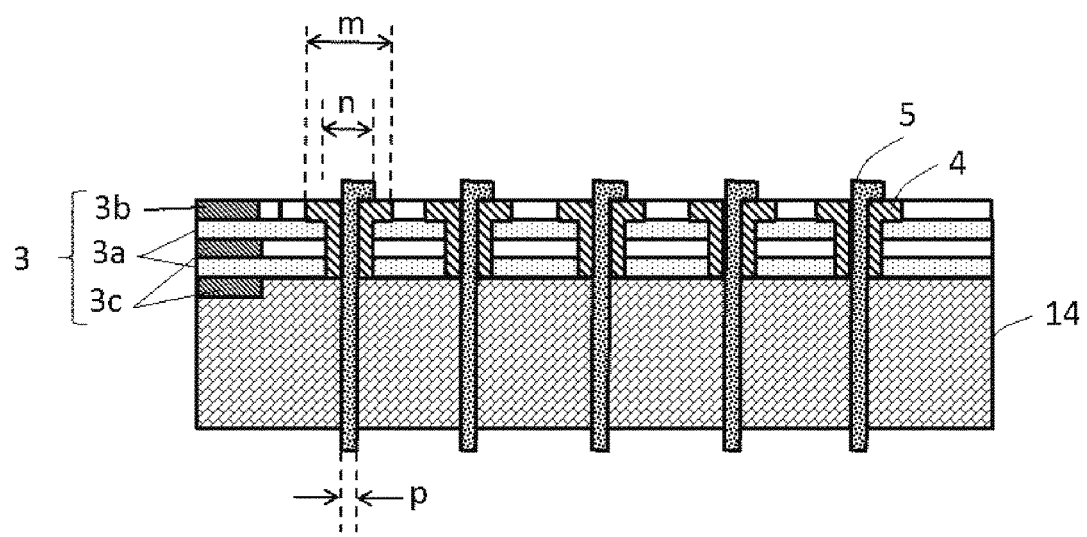
FIG. 8 is a view of a different aspect of the A-A cross section of the second insulating circuit substrate shown in FIG. 6.
Figure 9:
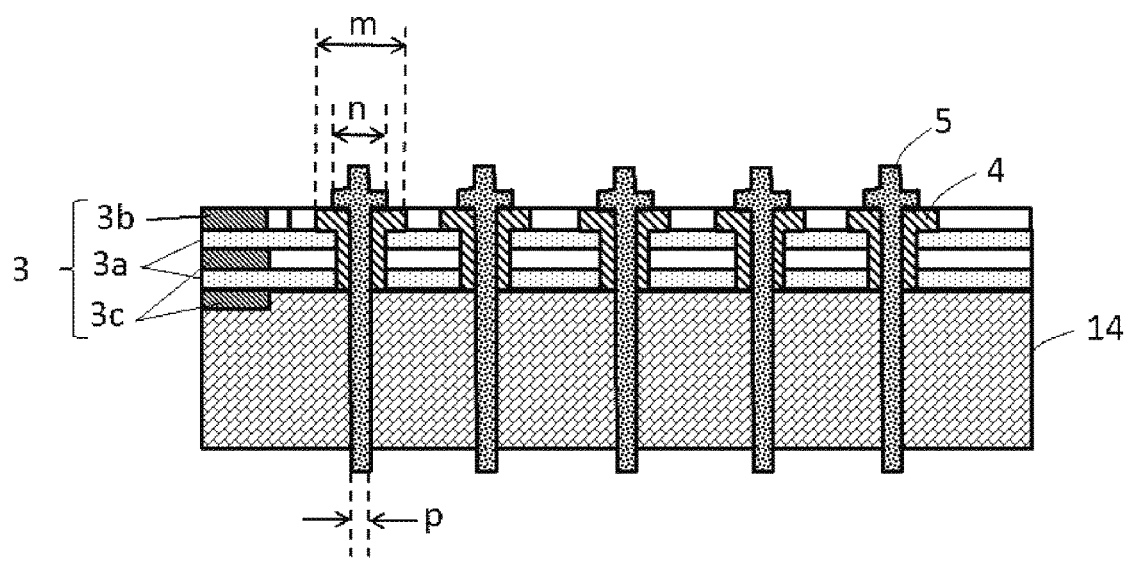
FIG. 9 is a view of a different aspect of the A-A cross section of the second insulating circuit substrate shown in FIG. 6.
Figure 10:
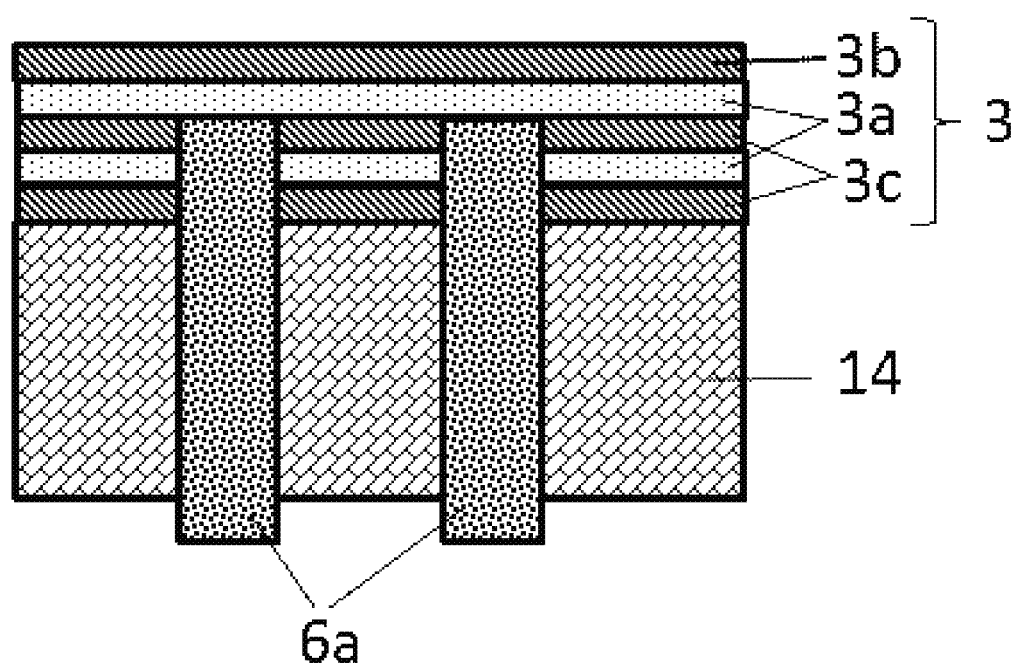
FIG. 10 is a view of the cross section of the second insulating circuit substrate shown by the arrows B-B in FIG. 4.
Figure 11:
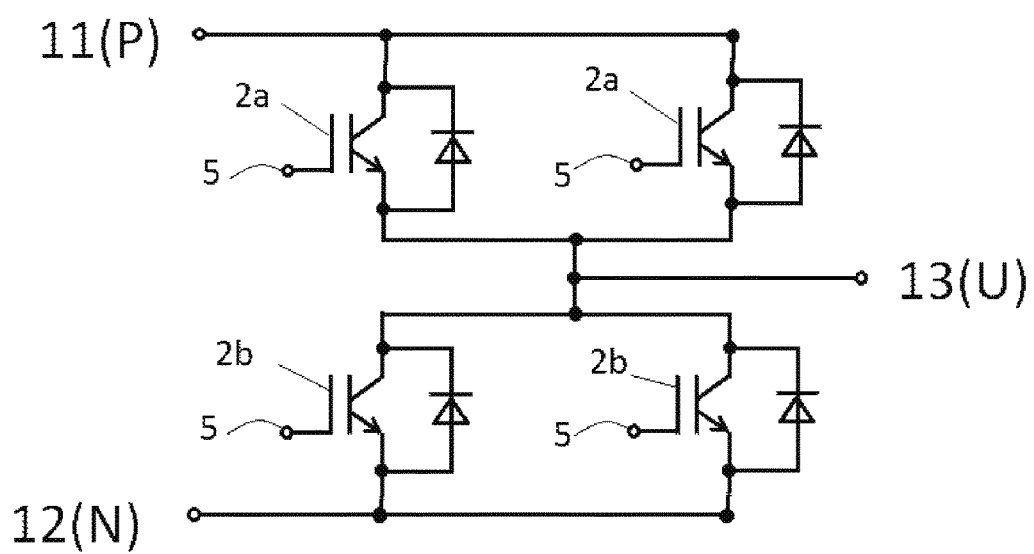
FIG. 11 is a main circuit diagram of the semiconductor device according to one embodiment of the present invention.

FIG. 1 is an exploded perspective view of a semiconductor device according to one embodiment of the present invention. FIG. 2 is an oblique view from below of a second insulating circuit substrate of the semiconductor device according to one embodiment of the present invention. FIG. 3 is a top view of the second insulating circuit substrate of the semiconductor device according to one embodiment of the present invention. FIG. 4 is a perspective view of the bottom of the second insulating circuit substrate of the semiconductor device according to one embodiment of the present invention as seen from the top side. FIG. 5 is a top view of the first insulating circuit substrate of the semiconductor device according to one embodiment of the present invention. FIG. 6 is a view of the cross section of the second insulating circuit substrate shown by the arrows A-A in FIG. 3. FIGS. 7 to 9 are views of different aspects of the A-A cross section of the second insulating circuit substrate shown in FIG. 6. FIG. 10 is a view of the cross section of the second insulating circuit substrate shown by the arrows B-B in FIG. 4. FIG. 11 is a main circuit diagram of the semiconductor device according to one embodiment of the present invention.

The semiconductor device according to one aspect of the present invention includes: a first insulating circuit substrate 1; a first insulating plate 1a; a first conductive member 1b; a second conductive member 1c; a third conductive member 1d; a fourth conductive member 1e; upper arm semiconductor chips (first semiconductor chips) 2a; control electrode pads 2a1 of the upper arm semiconductor chips; lower arm semiconductor chips (second semiconductor chips) 2b; control electrode pads 2b1 of the lower arm semiconductor chips; a second insulating circuit substrate 3; insulating layers 3a; a conductive layer 3b; third conductive layers 3c; a first conductive layer 3d; a through-hole 3e; a through-hole 3f; a through-hole 3g; a through-hole (third through-hole) 3h; a through-hole 3i; a second conductive layer 3j; a fourth conductive layer 3k; cylindrical conductive members 4; T-shaped pins (first pins) 5; first main electrode pins (second pins) 6a; second main electrode pins (second pins) 6b; externally drawn-out control terminals (external control terminals) 7; a conductive block 8; a conductive block 9; a conductive block 10; a conductive block (P) 11; a conductive block (N) 12; a conductive block (U) 13; and a sealing resin 14.

The first insulating circuit substrate includes, on the first insulating plate 1a: the first conductive member 1b, the second conductive member 1c, the third conductive member 1d, and the fourth conductive member 1e.

The conductive block 11 is provided on the first conductive member 1b via solder. The conductive block 8 and conductive block (U terminal) 13 are provided on the second conductive member 1c via solder. The conductive block 9 is provided on the third conductive member 1d via solder. The conductive block (N terminal) 12 is provided on the fourth conductive member 1e via solder. Each of the conductive blocks 11, 8, 13, 9, and 12 has, on at least a portion of the outer periphery of the block, a step protruding further than the top of the block in the lateral direction.

Furthermore, there are two semiconductor chips 2a provided on the first conductive member 1b via solder, and two semiconductor chips 2b provided on the second conductive member 1c via solder.

The semiconductor chips 2a and 2b each include a plurality of control electrodes 2a1 and 2b1. The first semiconductor chips 2a are the upper arm semiconductor chips, and the second semiconductor chips 2b are the lower arm semiconductor chips. The main circuit configuration of this semiconductor device is shown in FIG. 11.

The second insulating circuit substrate is disposed above the first insulating circuit substrate. The second insulating circuit substrate is a multilayer wiring substrate in which a conductive layer 3c, an insulating layer 3a, a conductive layer 3a, and an insulating layer 3a have been laminated in the stated order, and the two conductive layers 3c have the same potential (see FIG. 6). The second insulating circuit substrate respectively includes through-holes above the first conductive member, above the second conductive member, above the third conductive member, and above the fourth conductive member, which are the through-holes 3e, 3f, 3g, 3h, and 3i through which the conductive blocks 11, 8, 13, 9, and 12 are inserted. Conductive layers are formed on the inner periphery of the through-holes 3e, 3f, 3g, 3h, and 3i and the outer peripheral regions on the top/bottom surfaces thereof. Moreover, the second insulating circuit substrate includes a plurality of first through-holes 3l and a plurality of second through-holes 3m, and the cylindrical conductive members 4 are respectively inserted into the first through-holes 3l. The shape of the conductive members 4 is not limited to being cylindrical, as long as the conductive members 4 are respectively provided on the inner wall and/or outer periphery of the end of the first through-holes 3l.

FIG. 6 is a view of the cross section of the second insulating circuit substrate shown by the arrows A-A in FIG. 3. The conductive layers 3c are not disposed around the cylindrical conductive members 4. Furthermore, the second insulating circuit substrate includes a wiring layer 3n that connects the first through-holes and the second through-holes. One end of each of the externally drawn-out control terminals 7 is inserted into each of the second through-holes 3m and conductively connected to the T-shaped pins (first pins) 5 via the wiring layer 3n.

The T-shaped pins (first pins) 5 have at one end a columnar part connected to the control electrodes 2a1 and 2b1 of the semiconductor chips 2a and 2b, and at the other end a head part that is wider than the inner diameter of the first through-holes 3l. The columnar part of the T-shaped pins (first pins) 5 is inserted into the hollow section of the cylindrical conductive member 4. The intervals between the T-shaped pins (first pins) are narrower than the intervals between the externally drawn-out control terminals. The columnar part of the T-shaped pins (first pins) is smaller than the diameter of the externally drawn-out control terminals. It is preferable that the diameter of the columnar part of the T-shaped pins (first pins) be not less than 0.1 mm and not more than 1 mm.

FIGS. 7 to 9 show different aspects of the head part of the first pins. The head part of the first pins in FIG. 7 is a rivet shape. The head part of the first pins in FIG. 8 is an L shape. The head part of the first pins in FIG. 9 is a shape whereby a columnar part further extends beyond a flat plate. The length of the columnar part of the first pins may be greater than that of the hollow section of the cylindrical conductive members 4.

FIG. 10 is a view of the cross section of the second insulating circuit substrate shown by the arrows B-B in FIG. 4. The bottom side of the second insulating circuit substrate has holes penetrating through the bottommost conductive layer 3c of the second insulating circuit substrate and the bottommost insulating layer 3a of the second insulating circuit substrate, and the main electrode pins (second pins) 6a and 6b are conductively connected to the two conductive layers 3c. The second insulating circuit substrate may be a multilayer wiring substrate in which, defining an insulating layer and conductive layer as one group, two or more groups may be laminated together. The main electrode pins (second pins) are conductively connected to the conductive layers sandwiched between the insulating layers of the second insulating circuit substrate. In FIG. 7, two conductive layers 3c are used, but it is possible to have only a rear surface conductive layer by providing one conductive layer.

The first insulating circuit substrate 1 includes, on the first insulating plate 1a, the first conductive member 1b having the first semiconductor chips 2a disposed on the top thereof, and the second conductive member 1c having the second semiconductor chips 2b disposed on the top thereof. The second insulating circuit substrate 3 has the insulating layers 3a, the first conductive layer 3d in a region on the bottom of the insulating layer 3a facing the first conductive member 1b, and the third conductive layer 3c in a region on the bottom of the insulating layer 3a facing the second conductive member 1c. The second insulating circuit substrate further includes the fourth conductive layer 3k on the top of the insulating layer 3a on the surface opposite to the first conductive layer 3d, and the third conductive layer 3c conductively connects to the fourth conductive layer 3k.

The first insulating circuit substrate also includes the conductive block on the second conductive member. The second insulating circuit substrate includes a third through-hole into which the conductive block is inserted. The first conductive member is conductively connected to the bottom of the first semiconductor chips. The top of the first semiconductor chips on the first conductive member is conductively connected to the first conductive layer provided on the bottom side of the second insulating circuit substrate via the second pins of the first semiconductor chips. The first conductive layer conductively connects to the bottom of the second semiconductor chips on the second conductive member via the second conductive member and the conductive blocks on the second conductive member. The top of the second semiconductor chips on the second conductive member is conductively connected to the third conductive layer provided on the bottom side of the second insulating circuit substrate via the second pins of the second semiconductor chips. The third conductive layer is conductively connected to the fourth conductive layer provided on the top of the second insulating circuit substrate.

The conductive block 11 on the first conductive member 1b is conductively connected to the bottom of the semiconductor chips 2a via the first conductive member 1b. The top of the semiconductor chips 2a on the first conductive member 1b is conductively connected to the bottom of the semiconductor chips 2b on the second conductive member 1c via the main electrode pins 5 of the semiconductor chips 2a, the conductive layer 3d provided on the bottom side of the second insulating circuit substrate 3, the conductive block 8 on the second conductive member 1c, and the second conductive member 1c. The top of the semiconductor chips 2b on the second conductive member 1c is conductively connected to the conductive block 12 on the fourth conductive member 1e via the main electrode pins 5 of the semiconductor chips 2b, the conductive layer 3c provided on the bottom side of the second insulating circuit substrate 3, the conductive block 9 on the third conductive member 1d, and the conductive layer 3k provided on the top of the second insulating circuit substrate 3.

The conductive blocks 8, 9, 11, 12, and 13 each have, on at least a portion of the outer periphery of the block, a step protruding further than the top of the block in the lateral direction.

The sealing resin 14 seals the space between the first insulating circuit substrate 1 and the second insulating circuit substrate 3.

The semiconductor chips 2a and 2b are vertical RC-IGBTs provided with a switching element and a diode.

As described above, the embodiment of the present invention makes it possible to provide a semiconductor device that can have a smaller installation area than conventional configurations and a shorter internal wiring distance for control signals.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
    a first insulating circuit substrate;
    a semiconductor chip that is disposed on the first insulating circuit substrate, the semiconductor chip including a plurality of control electrodes;
    a second insulating circuit substrate disposed above the semiconductor chip on the first insulating circuit substrate, the second insulating circuit substrate having a plurality of first through-holes, in which conductive members are respectively provided on an inner wall and/or on an outer periphery of one end of the first through-holes;
    first pins inserted into the first through-holes, respectively, each of the first pins having at one end a columnar part connected to one of the control electrodes of the semiconductor chip, and at another end, a head part that is wider than an inner diameter of the corresponding first through-hole; and
    external control terminals,
    wherein the second insulating circuit substrate further has a plurality of second through-holes into which the external control terminals are respectively inserted, and wiring layers conductively respectively connecting the conductive members and the external control terminals, and
    wherein intervals between the first pins are narrower than intervals between the external control terminals.

2. The semiconductor device according to claim 1, wherein a diameter of the columnar part of the first pins is less than a diameter of the external control terminals.

3. The semiconductor device according to claim 2, wherein the diameter of the columnar part of the first pins is not less than 0.1 mm and not more than 1 mm.

4. The semiconductor device according to claim 2, further comprising second pins,
wherein the second insulating circuit substrate further includes a rear surface conductive layer provided on a rear side facing the first insulating circuit substrate, and the second pins are conductively connected to the rear surface conductive layer.

5. The semiconductor device according to claim 2, further comprising second pins,
wherein the second insulating circuit substrate is a multilayer wiring substrate that includes conductive layers and insulating layers that are laminated alternately, and has holes penetrating through at least one of the insulating layers facing the first insulating circuit substrate, and
wherein the second pins are conductively connected to one of the conductive layers through said holes in the at least one of the insulating layers.

6. The semiconductor device according to claim 2, wherein the semiconductor chip is provided in a plurality, including a first semiconductor chip and a second semiconductor chip, and the first insulating circuit substrate includes:
a first insulating plate;
a first conductive member on the first insulating plate, mounting the first semiconductor chip on a top thereof; and
a second conductive member on the first insulating plate, mounting the second semiconductor chip on a top thereof, and
wherein the second insulating circuit substrate includes an insulating layer, a first conductive layer below the insulating layer in a first region corresponding to the first conductive member in position of the first insulating circuit substrate, and a second conductive layer on the insulating layer in a second region corresponding to the second conductive member in position of the first insulating circuit substrate,
wherein the second insulating circuit substrate further includes a third conductive layer below the insulating layer in the second region opposite to the second conductive layer, and a fourth conductive layer on the insulating layer in the first region opposite to the first conductive layer, and
wherein the third conductive layer is conductively connected to the fourth conductive layer through a hole in the insulating layer.

7. The semiconductor device according to claim 6, further comprising a plurality of second pins divided into a first group and a second group,
wherein the first insulating circuit substrate includes a conductive block on the second conductive member,
wherein the second insulating circuit substrate includes a third through-hole into which the third conductive block is inserted,
wherein the first conductive member is conductively connected to a bottom of the first semiconductor chip,
wherein a top of the first semiconductor chip is conductively connected to the first conductive layer via the first group of the second pins,
wherein the first conductive layer is conductively connected to a bottom of the second semiconductor chip on the second conductive member via the second conductive member and the conductive block, and
wherein a top of the second semiconductor chip is conductively connected to the third conductive layer via the second group of the second pins.

8. The semiconductor device according to claim 7, wherein the conductive block has, on at least a portion of an outer periphery, a step protruding further than a top of the conductive block in a lateral direction.

9. The semiconductor device according to claim 1, further comprising a sealing resin that seals a space between the first insulating circuit substrate and the second insulating circuit substrate.

10. The semiconductor device according to claim 9, wherein the semiconductor chip is a vertical RC-IGBT comprising a switching element and a diode.

11. The semiconductor device according to claim 3, further comprising a sealing resin that seals a space between the first insulating circuit substrate and the second insulating circuit substrate.

12. The semiconductor device according to claim 11, wherein the semiconductor chip is a vertical RC-IGBT comprising a switching element and a diode.

13. The semiconductor device according to claim 5, further comprising a sealing resin that seals a space between the first insulating circuit substrate and the second insulating circuit substrate.

14. The semiconductor device according to claim 13, wherein the semiconductor chip is a vertical RC-IGBT comprising a switching element and a diode.

15. The semiconductor device according to claim 7, further comprising a sealing resin that seals a space between the first insulating circuit substrate and the second insulating circuit substrate.

16. The semiconductor device according to claim 15, wherein the semiconductor chip is a vertical RC-IGBT comprising a switching element and a diode.

* * * * *